United States Patent [19]

Street

[11] 4,185,209
[45] Jan. 22, 1980

[54] CMOS BOOLEAN LOGIC CIRCUIT
[75] Inventor: Dana C. Street, Placentia, Calif.
[73] Assignee: Rockwell International Corporation, El Segundo, Calif.
[21] Appl. No.: 874,601
[22] Filed: Feb. 2, 1978
[51] Int. Cl.² .................. H03K 19/08; H03K 19/12; H03K 19/22; H03K 19/30
[52] U.S. Cl. .................................... 307/218; 307/205
[58] Field of Search ............... 307/203, 205, 215, 218

[56] References Cited
U.S. PATENT DOCUMENTS

| | | | |
|---|---|---|---|
| 3,305,735 | 2/1967 | Moreines | 307/218 X |
| 3,356,858 | 12/1967 | Wanlass | 307/205 |
| 3,577,005 | 5/1971 | Christensen | 307/205 |
| 3,676,705 | 7/1972 | Meyer | 307/251 |
| 3,683,201 | 8/1972 | Haraszti | 307/205 |
| 3,986,042 | 10/1976 | Padgett et al. | 307/205 |

*Primary Examiner*—Larry N. Anagnos
*Attorney, Agent, or Firm*—H. Fredrick Hamann; Daniel R. McGlynn

[57] ABSTRACT

Compact and high speed logic circuits that utilize CMOS technology to perform the Boolean operations A·B and A+B. The presently disclosed logic circuits are comprised of a field effect transistor and first and second logic performing diodes which are uniquely interconnected with one another so as to reduce the number of circuit components and to increase the operating speed relative to conventional logic circuits.

4 Claims, 6 Drawing Figures

| | | "A" | |
|---|---|---|---|
| | | 1 | 0 |
| "B" | 1 | HI | LOW |
| | 0 | LOW | LOW |

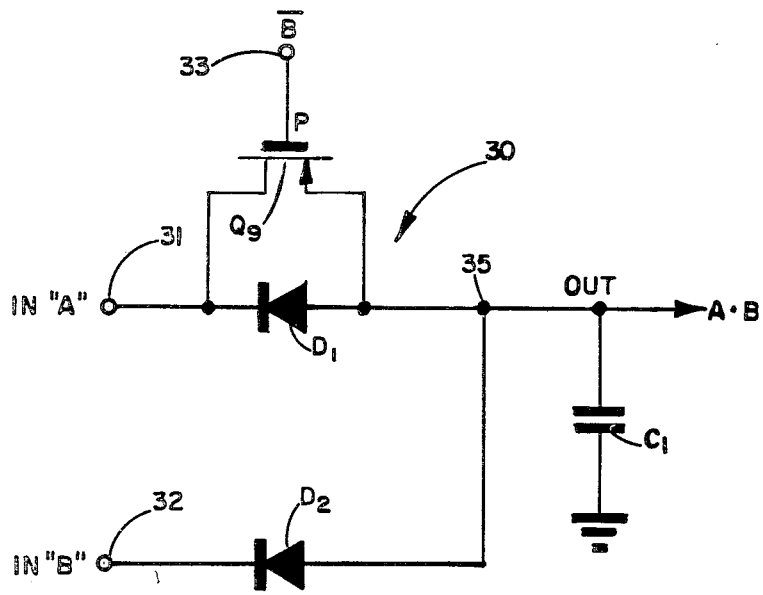
FIG. 3a
FIG. 3b
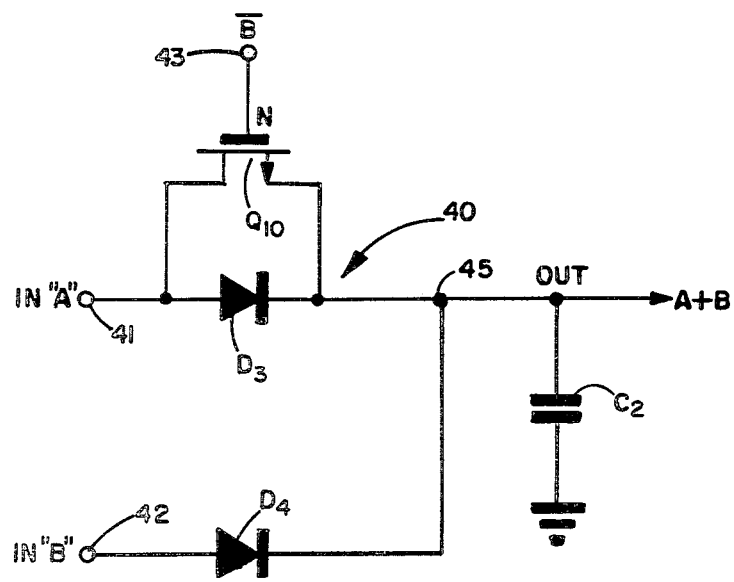
FIG. 4a
FIG. 4b

CMOS BOOLEAN LOGIC CIRCUIT

The invention herein described was made in the course of or under a contract or subcontract thereunder with the Department of the Air Force.

BACKGROUND OF THE INVENTION

1. Field of the Invention.

This invention relates to compact diode logic circuits that utilize CMOS technology to perform the Boolean operations A·B and A+B.

2. Statement of the Prior Art.

The conventional CMOS logic circuits (see FIGS. 1 and 2 of the accompanying drawings and the corresponding description thereof) that perform the Boolean operations A·B and A+B are typically mechanized by a plurality (e.g. four) of CMOS field effect transistors and an inverter gate. This mechanization undesirably consumes a relatively large amount of area. Moreover, because of the relatively high inherent on-resistance of the field effect transistors, the speed of the conventional logic circuits is minimized.

No patents are known which show or disclose a CMOS logic circuit that performs the Boolean function A·B or A+B, which circuit is comprised of a field effect transistor device and a plurality of diodes that are interconnected to perform logic, like that disclosed in the subject patent application. One example of a patent which discloses CMOS diode logic gates is the following:

U.S. Pat. No. 3,986,042 Oct. 12, 1976.

However, this aforementioned patent does not disclose a plurality of logic performing diodes, each receiving a respective logic level input signal to be gated according to the Boolean function A·B or A+B, as disclosed and claimed by the present invention. Other conventional circuits which include a diode connected across the conduction path of a field effect transistor device are shown in the following patents:

U.S. Pat. No. 3,621,292 Nov. 16, 1971
U.S. Pat. No. 3,638,046 Jan. 25, 1972

However, neither the circuits nor the respective diodes of the aforementioned patents are utilized to either receive input logic level signals or to perform Boolean operations, as is disclosed and claimed in the subject patent application.

SUMMARY OF THE INVENTION

Briefly, and in general terms, CMOS logic circuits are disclosed to perform the Boolean operations A·B and A+B. The disclosed logic circuits each include three input terminals and an output terminal. First and second logic performing diodes are respectively connected between a first and a second of the circuit input terminals and the circuit output terminal. The first and second input terminals are adapted to receive the respective logic level signals designated A and B. A metal oxide semiconductor field effect transistor device (MOSFET) is connected across the conduction path of one of the first or second logic diodes. The third of the input terminals is connected to the gate electrode of the field effect transistor and is adapted to receive the logic level signal $\overline{B}$. Either the logical operation A·B or A+B is performed by the presently disclosed logic circuits, depending upon the conductivity type of the field effect transistor (either p or n) and the bias connection of the first and second logic diodes with respect to the circuit input and output terminals.

BRIEF DESCRIPTION OF THE DRAWINGS

FIG. 3a is a schematic of the improved, compact logic circuit of the present invention for performing the Boolean operation A·B.

FIG. 3b shows the truth table corresponding to the logic performed by the circuit of FIG. 3a.

FIG. 4a is a schematic of the improved, compact CMOS circuit of the instant invention for performing the Boolean operation A+B.

FIG. 4b shows the truth table corresponding to the logical operation performed by the circuit of FIG. 4a.

DESCRIPTION OF THE PREFERRED EMBODIMENT

Figure 1:
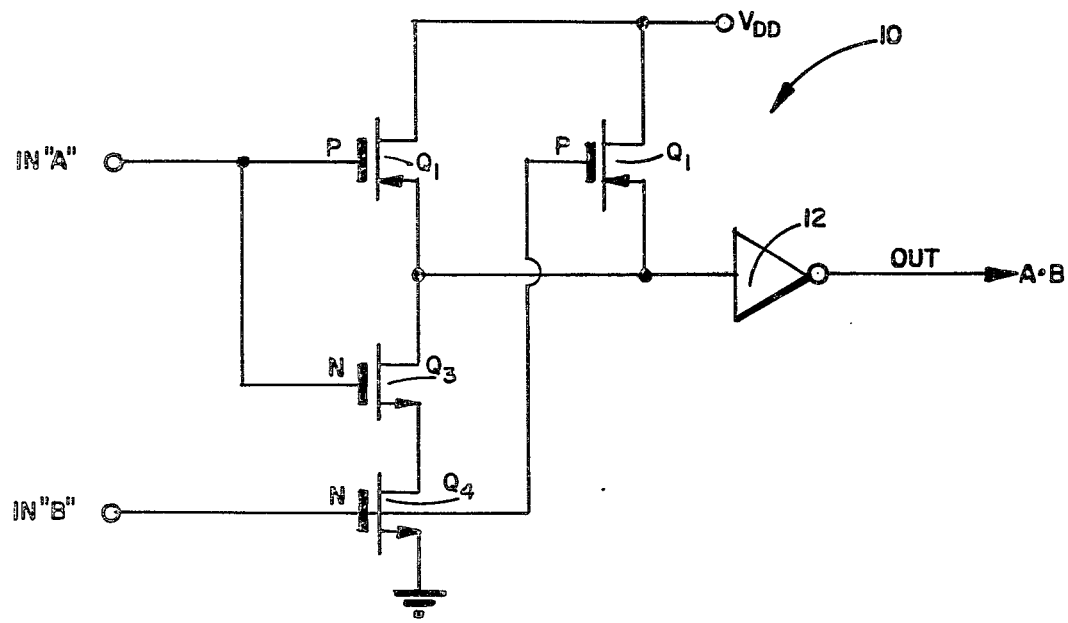
FIGS. 1 and 2 show prior art CMOS circuits for performing the Boolean logic operations A·B and A+B, respectively.
Figure 2:
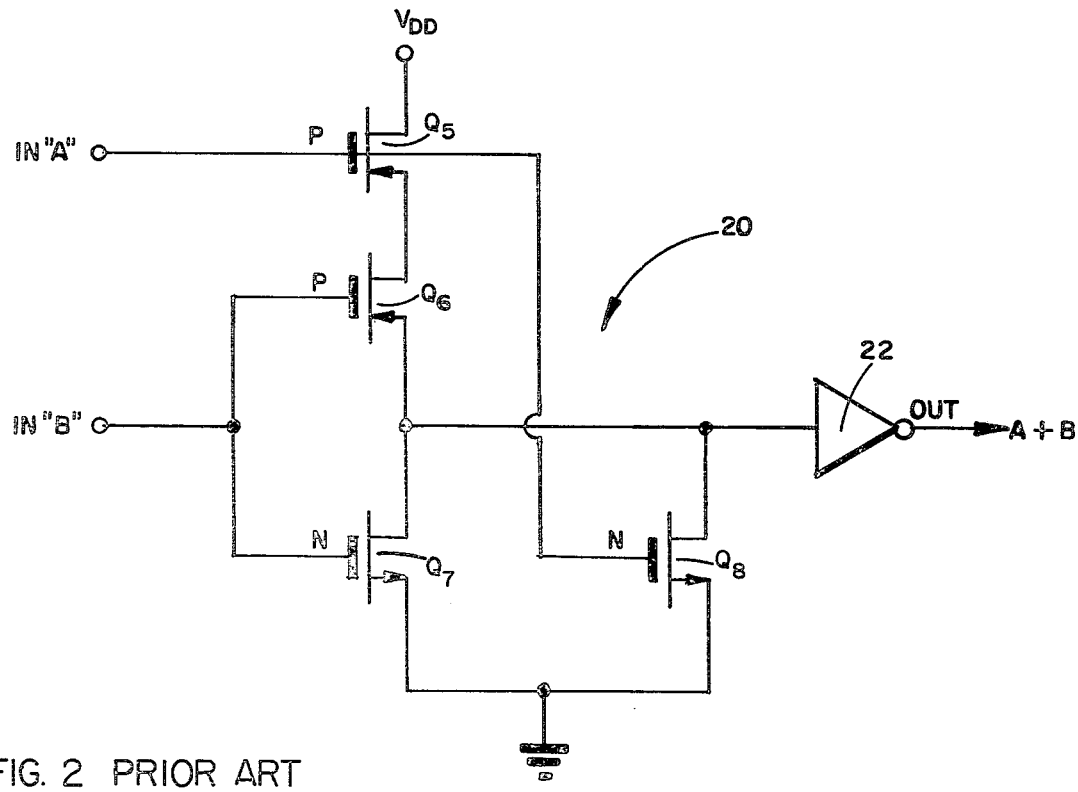

Referring to FIGS. 1 and 2 of the drawings, conventional CMOS logic circuits 10 and 20 are shown for performing the Boolean operations A·B and A+B, respectively. The logic circuit 10, which performs the operation A·B, is comprised of a pair of p-channel field effect transistors (FETs) $Q_1$ and $Q_2$ interconnected with a pair of n-channel FETs $Q_3$ and $Q_4$. An inverter gate 12 is connected between the logic circuit output terminal and a common electrical junction formed by the conduction paths of FETs $Q_1$, $Q_2$ and $Q_3$. The logic circuit 20, which performs the operation A+B, is comprised of a pair of p-channel FETs $Q_5$ and $Q_6$ interconnected with a pair of n-channel FETs $Q_7$ and $Q_8$. An inverter gate 22 is connected between the logic circuit output terminal and a common electrical junction formed by the conduction paths of FETs $Q_6$, $Q_7$ and $Q_8$.

Each of the prior art logic circuits 10 and 20 of FIGS. 1 and 2 is mechanized by four field effect transistor devices and an inverter gate 12 or 22. Typically, such an inverter gate is mechanized by the interconnection of a complementary pair of p and n-channel field effect transistors. Therefore, the relatively large number (e.g. six) of field effect transistor devices utilized to mechanize each of the prior art logic circuits 10 and 20 results in the undesirable consumption of large amounts of space. Moreover, because of the relatively high inherent on-resistance of field effect transistors, the speed of the conventional logic circuits 10 and 20 is minimized. Inasmuch as the prior art logic circuits 10 and 20 are well known, the respective operations thereof will not be described herein.

In accordance with the present invention, FIGS. 3a and 4a show the preferred high speed, compact logic circuits for performing the Boolean functions A·B and A+B, respectively. Referring initially to FIG. 3a, the instant circuit 30 includes first and second input terminals 31 and 32 and an output terminal 35. Input terminals 31 and 32 are adapted to receive respective first and second logic level signals designated A and B. The cathode electrode of a first logic performing diode $D_1$ is connected to the input terminal 31. The anode electrode of logic diode $D_1$ is connected to the circuit output terminal 35. The conduction path of a field effect transistor (FET) $Q_9$ is connected across the conduction path of the logic diode $D_1$. More particularly, the source electrode of FET $Q_9$ is connected to the anode electrode of logic diode $D_1$, and the drain electrode of FET $Q_9$ is connected to the cathode electrode of logic diode $D_1$. In a preferred embodiment, FET $Q_9$ is a p-channel MOS device. The control or gate electrode of FET $Q_9$ is connected to a third input terminal 33. Input terminal 33 is adapted to receive a signal $\overline{B}$, the logic level of which is inverted with respect to that of the signal applied to the input terminal 32. The cathode electrode of a second logic performing diode $D_2$ is connected to the second input terminal 32. The anode electrode of the logic diode $D_2$ is connected to the circuit output terminal 35. A load capacitor $C_1$ may be connected between the circuit output terminal 35 and a source of reference potential, such as ground, to facilitate the application of an output signal to a subsequent logic circuit (not shown).

FIG. 3b represents the truth table that corresponds to the logic performed by the circuit 30 illustrated in FIG. 3a. The operation of the compact, high speed logic circuit 30 for performing the Boolean function A·B is best understood when referring concurrently to FIGS. 3a and 3b. The logic circuit 30 is mechanized so as to utilize positive logic to perform the Boolean function A·B. That is, a relatively positive voltage signal (e.g. +5 volts d.c.) represents a logical "1" or a HI logic level signal, and a relatively negative voltage signal (e.g. ground) represents a logical "0" or a LOW logic level signal. By way of a first example, relatively HI logic level signals A and B are respectively applied to each of the circuit input terminals 31 and 32. Therefore, a relatively LOW logic level signal $\overline{B}$ is applied to the circuit input terminal 33. Inasmuch as relatively positive or HI voltage signals A and B are applied to each of the circuit input terminals 31 and 32 and, accordingly, to the cathode electrodes of the logic diodes $D_1$ and $D_2$ (with respect to the signal at the anode electrodes thereof), each of the logic diodes $D_1$ and $D_2$ is rendered in a back biased or non-conductive condition. However, inasmuch as a relatively negative or LOW voltage signal $\overline{B}$ is applied to the circuit input terminal 33 and, accordingly, to the gate electrode of p-channel FET $Q_9$, FET $Q_9$ is rendered conductive. Therefore, a conduction path is provided between the circuit input terminal 31 and the circuit output terminal 35 via the conduction path of FET $Q_9$. As a result, the circuit output terminal 35 receives a relatively HI logic level signal (e.g. approximately +5 volts), which signal, as previously disclosed, is indicative of a logical "1". The relatively HI output signal of output terminal 35 charges load capacitor $C_1$, so that an indication of the output logic level can be conveniently stored for application to a subsequent logic circuit.

By way of a second example, a relatively LOW logic level signal B is applied to one of the circuit input terminals (e.g. 32). Therefore, a relatively HI logic level signal $\overline{B}$ is applied to the circuit input terminal 33. The relatively HI logic level signal A continues to be applied to the other circuit input terminal 31. In operation, FET $Q_9$ is rendered non-conductive, inasmuch as the gate electrode thereof receives a relatively positive logic level signal $\overline{B}$ from the circuit input terminal 33. The first logic diode $D_1$ remains in a back biased or non-conductive condition, inasmuch as the cathode electrode thereof receives the relatively positive or HI logic level signal A from the circuit input terminal 31, and the anode electrode thereof receives the relatively HI logic level signal from the load capacitor $C_1$ (previously charged to a HI logic level) via the circuit output terminal 35. However, the second logic diode $D_2$ is rendered in a forward biased or conductive condition, inasmuch as a relatively negative or LOW logic level signal B is applied to the cathode electrode thereof from the circuit input terminal 32, while a relatively positive or HI logic level signal is applied to the anode electrode thereof from the circuit output terminal 35. As a result, the previously charged capacitor $C_1$ is discharged, and the circuit output terminal 35 is clamped to a relatively LOW logic level signal (i.e. substantially ground) that is indicative of a logical "0" via the conduction path of logic diode $D_2$ and the circuit input terminal 32. Thus, whenever a relatively LOW logic level signal A or B is applied to one of the circuit input terminals 31 or 32, the circuit output terminal 35 is clamped to a relatively LOW logic level signal via a discharge path that comprises the corresponding logic diode $D_1$ or $D_2$. Therefore, the operation of the circuit 30 of the instant invention to perform the logical function A·B for the remaining input conditions, as described by the truth table of FIG. 3b, will be apparent to those skilled in the art.

Referring to FIG. 4a, the high speed, compact logic circuit for performing the Boolean function A+B is shown. The instant circuit 40 includes first and second input terminals 41 and 42 and an output terminal 45. Input terminals 41 and 42 are adapted to receive respective first and second logic level signals A and B. The anode electrode of a first logic performing diode $D_3$ is connected to the input terminal 41. The cathode electrode of logic diode $D_3$ is connected to the circuit output terminal 45. The conduction path of a field effect transistor (FET) $Q_{10}$ is connected across the conduction path of the logic diode $D_3$. More particularly, the source electrode of FET $Q_{10}$ is connected to the cathode electrode of logic diode $D_3$, and the drain electrode of FET $Q_{10}$ is connected to the anode electrode of logic diode $D_3$. In a preferred embodiment, FET $Q_{10}$ is an n-channel MOS device. The control or gate electrode of FET $Q_{10}$ is connected to a third input terminal 43. Input terminal 43 is adapted to receive a signal $\overline{B}$, the logic level of which is inverted with respect to that of the signal applied to the input terminal 42. The anode electrode of a second logic performing diode $D_4$ is connected to the second input terminal 42. The cathode electrode of the logic diode $D_4$ is connected to the circuit output terminal 45. A load capacitor $C_2$ may be connected between the circuit output terminal 45 and a source of reference potential, such as ground.

FIG. 4b represents the truth table that corresponds to the logic performed by the circuit 40 illustrated in FIG. 4a. The operation of the compact, high speed logic circuit 40 for performing the Boolean function A+B is best understood when referring concurrently to FIGS. 4a and 4b. The logic circuit 40 is mechanized so as to utilize positive logic (described in greater detail when referring to the logic circuit 30 of FIG. 3a) to perform the Boolean function A+B. By way of a first example, a relatively HI logic level signal B is applied to one of the circuit input terminals (e.g. 42). Therefore, a relatively LOW logic level signal $\overline{B}$ is applied to the circuit input terminal 43. As a result, n-channel FET $Q_{10}$ is rendered non-conductive, inasmuch as the relatively LOW logic level signal $\overline{B}$ is applied to the gate electrode thereof from the circuit input terminal 43. Moreover, the second logic diode $D_4$ is rendered in a forward biased or conductive condition, inasmuch as the anode electrode thereof receives the relatively positive or HI logic level signal B (with respect to the signal at the cathode electrode thereof) from the circuit input terminal 42. Therefore, a conduction path is provided between the circuit input terminal 42 and the circuit output terminal 45 via the conduction path of the logic diode $D_4$. Hence, when either one of the logic circuit input terminals 41 or 42 receives a relatively HI logic level signal, the circuit output terminal 45 receives a relatively HI logic level signal (e.g. approximately +5 volts), which signal is indicative of a logical "1". The relatively HI output signal on output terminal 45 charges load capacitor $C_2$, so that an indication of the output logic level can be conveniently stored for subsequent utilization.

It is to be understood that if a relatively HI logic level signal A is likewise applied to the circuit input signal 41, the first logic diode $D_3$ is also rendered in a forward biased or conductive condition (as previously disclosed when referring to diode $D_4$) to charge load capacitor $C_2$ via the conduction path of diode $D_3$. However, if a relatively LOW logic level signal A is otherwise applied to the circuit input terminal 41, the first logic diode $D_3$ is rendered in a back biased or non-conductive condition (as will be described hereinafter) so that the load capacitor $C_2$ is charged solely by means of the conduction path of the second logic diode $D_4$.

By way of a second example, relatively LOW logic level signals A and B are respectively applied to each of the circuit input terminals 41 and 42. Therefore, a relatively HI logic level signal $\overline{B}$ is applied to the circuit input terminal 43. As a result, each of the first and second logic diodes $D_1$ and $D_2$ are rendered in a back biased or non-conductive condition, inasmuch as a relatively positive or HI logic level signal is applied to the respective cathode electrodes of diodes $D_3$ and $D_4$ from the load capacitor $C_2$ (previously charged to a HI logic level) via the circuit output terminal 45, while a relatively negative or LOW logic level signal is applied to the respective anode electrodes of diodes $D_3$ and $D_4$ from the corresponding circuit input terminals 41 and 42. Inasmuch as a relatively positive or HI voltage signal $\overline{B}$ is applied to the circuit input terminal 43 and, accordingly, to the gate electrode of n-channel FET $Q_{10}$, FET $Q_{10}$ is rendered conductive. Thus, the previously charged load capacitor $C_2$ is discharged, and the circuit output terminal 45 is clamped to a relatively LOW logic level signal via the conduction path of the FET $Q_{10}$ and the circuit input terminal 41. Thus, whenever relatively LOW logic level signals A and B are simultaneously applied to each of the circuit input terminals 41 and 42, the circuit output terminal 45 is clamped to a relatively LOW logic level signal which signal is indicative of a logical "0", via a discharge path that comprises the conduction path of FET $Q_{10}$. In view of the foregoing, the operation of the circuit 40 of the instant invention to perform the logical function A+B for the remaining input conditions, as described by the truth table of FIG. 4b, will be apparent to those skilled in the art.

By virtue of the present invention, the compact CMOS diode logic circuits 30 and 40 can be laid out in a smaller area than the conventional CMOS logic circuits, such as those illustrated in FIGS. 1 and 2. What is more, the present logic circuits are faster than those of the prior art, because the logic performing diodes have a lower on-resistance/unit area than the field effect transistors utilized to mechanize conventional CMOS logic circuits.

It will be apparent that while a preferred embodiment of the invention has been shown and described, various modifications and changes may be made without departing from the true spirit and scope of the invention. For example, although the presently disclosed logic circuits 30 and 40 perform Boolean operations for two logic level input signals A and B, it is to be understood that the instant invention is not limited to the gating of only two input signals. Any number of input signals C . . . N may be logically combined by means of the present circuits. However, the conduction path of a respective logic performing diode is connected between each additional circuit input terminal and the circuit output terminal. Moreover, for each additional input terminal included, a corresponding field effect transistor is connected in electrical series with one of the FETs $Q_9$ or $Q_{10}$, depending upon the Boolean function to be performed. Thus, the respective gate electrodes of the additional corresponding field effect transistors are connected to receive the input signals $\overline{C}$ . . . $\overline{N}$.

Having thus set forth a preferred embodiment of the present invention, what is claimed is:

1. A logic circuit to perform functions of Boolean logic comprising:
    a plurality of input terminals to receive respective logic signals and an output terminal, including a first input terminal which receives a first logic signal, a second input terminal which receives a second logic signal, and a third input terminal which receives a third logic signal, said third logic signal being inverted with respect to that of said second logic signal;
    a first diode having respective anode and cathode terminals connected between a first of said plurality of input terminals and said output terminal,
    a second diode having respective anode and cathode terminals connected between a second of said plurality of input terminals and said output terminal, and
    a field effect transistor having a pair of conduction path terminals and a control terminal, a first conduction path terminal of said field effect transistor connected to the anode electrode of said first diode, a second conduction path terminal of said field effect transistor connected to the cathode electrode of said first diode, and said control terminal of said field effect transistor connected to said third input terminal.

2. A logic circuit as defined in claim 1, wherein said field effect transistor is a p-channel MOS device.

3. A logic circuit as defined in claim 1, wherein said field effect transistor is an n-channel MOS device.

4. A logic circuit as defined in claim 1 further comprising a load capacitor connected between said output terminal and ground.

* * * * *